US012765030B2

(12) United States Patent
Yu et al.

(10) Patent No.: US 12,765,030 B2
(45) Date of Patent: Oct. 13, 2026

(54) SEMICONDUCTOR APPARATUS, FABRICATION METHOD THEREOF AND MEMORY SYSTEM

(71) Applicant: YANGTZE MEMORY TECHNOLOGIES CO., LTD., Wuhan (CN)

(72) Inventors: Xuelian Yu, Wuhan (CN); Yanwei Shi, Wuhan (CN); Hu Ding, Wuhan (CN); Yuxuan Ren, Wuhan (CN)

( * ) Notice: Subject to any disclaimer, the term of this patent is extended or adjusted under 35 U.S.C. 154(b) by 518 days.

(21) Appl. No.: 18/365,049

(22) Filed: Aug. 3, 2023

(65) Prior Publication Data

US 2025/0048705 A1 Feb. 6, 2025

(51) Int. Cl.

| | |
|---|---|
| ***H10D 64/01*** | (2025.01) |
| ***H10D 84/01*** | (2025.01) |
| ***H10D 84/03*** | (2025.01) |
| ***H10D 84/83*** | (2025.01) |

(52) U.S. Cl.
CPC ....... *H10D 64/021* (2025.01); *H10D 84/0147* (2025.01); *H10D 84/038* (2025.01); *H10D 84/83* (2025.01)

(58) Field of Classification Search
CPC ............. H10D 64/021; H10D 84/0147; H10D 84/038; H10D 84/83
See application file for complete search history.

(56) References Cited

U.S. PATENT DOCUMENTS

2008/0308872 A1* 12/2008 Bu ........................ H10D 84/038 257/E21.632
2017/0162576 A1* 6/2017 Kim ........................ H10D 89/10

* cited by examiner

*Primary Examiner* — Fernando L Toledo
*Assistant Examiner* — Adam S Bowen
(74) *Attorney, Agent, or Firm* — Conley Rose, P.C.

(57) ABSTRACT

The present disclosure relates to a semiconductor apparatus, a fabrication method thereof, and a memory system. In the present disclosure, different semiconductor devices (e.g., a high-voltage device and a low-voltage device) of a semiconductor apparatus are provided with gate spacers of different thicknesses by two dielectric deposition operations. Due to the use of the two dielectric deposition operations, the present disclosure can both provide a high-voltage device with a gate spacer having a relatively larger thickness and provide a low-voltage device with a gate spacer having a relatively smaller thickness, such as a thin gate spacer having a thickness less than 8 nm.

20 Claims, 15 Drawing Sheets

SEMICONDUCTOR APPARATUS, FABRICATION METHOD THEREOF AND MEMORY SYSTEM

TECHNICAL FIELD

The present disclosure is generally related to the field of semiconductor fabrication, and in particular to a semiconductor apparatus, a fabrication method thereof, and a memory system.

BACKGROUND

During front end processes for a semiconductor device, a gate spacer is formed by growing a dielectric on sidewalls and top surface of a gate stack (including a gate and a gate dielectric) located on a semiconductor substrate, and then removing a portion of the dielectric on the top surface of the gate stack to leave the dielectric only on the sidewalls of the gate stack. During the subsequent processes, the spacer is used as a mask layer to form source/drain regions in active areas of the substrate on opposite sides of the gate stack. For example, the source/drain regions may be formed by performing ion implantation or epitaxial growth in the active areas. The processes are well known to those skilled in the art and will not be described in detail herein.

When used to fabricate a gate spacer for semiconductor devices with different operating voltages (e.g., a high-voltage device operating with a higher voltage and a low-voltage device operating with a lower voltage), the processes described above will form the gate spacers with the same thickness on the sidewalls of the gate stacks of the high-voltage device and low-voltage device.

SUMMARY

The present disclosure provides a semiconductor apparatus, a fabrication method thereof, and a memory system.

In one aspect of the present disclosure, a method of fabricating a semiconductor apparatus is provided. The method includes: providing a semiconductor substrate; forming a first gate stack and a second gate stack respectively on a first semiconductor device region and a second semiconductor device region of the semiconductor substrate, the first gate stack including a first gate and a first gate dielectric and the second gate stack including a second gate and a second gate dielectric; performing a first deposition operation of depositing a first dielectric material to form the first dielectric material over a top surface and sidewalls of the first gate stack and over a top surface and sidewalls of the second gate stack; removing portions of the first dielectric material on the sidewalls of the second gate stack; and performing a second deposition operation of depositing the first dielectric material over the top surface and sidewalls of the first gate stack and over the top surface and sidewalls of the second gate stack to form the first dielectric material over the sidewalls of the first gate stack and the sidewalls of the second gate stack, and a first gate spacer formed over the sidewalls of the first gate stack has a thickness larger than that of a second gate spacer formed on the sidewalls of the second gate stack.

In some examples, the first semiconductor device region and the second semiconductor device region include first active areas and second active areas respectively, wherein the first active areas are located on opposite sides of the first gate stack, and the second active areas are located on opposite sides of the second gate stack, and wherein the first deposition operation further includes: depositing the first dielectric material over top surfaces of the first active areas and over top surfaces of the second active areas.

In some examples, removing the portions of the first dielectric material over the sidewalls of the second gate stack includes: forming a mask layer over the first semiconductor device region; and removing the portions of the first dielectric material over the sidewalls of the second gate stack.

In some examples, the second deposition operation includes: after removing the mask layer, depositing the first dielectric material over the top surfaces of the first active areas and the top surface and sidewalls of the first gate stack and over the top surfaces of the second active areas and the top surface and sidewalls of the second gate stack; and removing portions of the first dielectric material over the top surfaces of the first active areas and the top surface of the first gate stack and portions of the first dielectric material over the top surfaces of the second active areas and the top surface of the second gate stack.

In some examples, before removing the portions of the first dielectric material over the sidewalls of the second gate stack, the method further includes: removing portions of the first dielectric material over top surfaces of first active areas of the first semiconductor device region and a top surface of the first gate stack and portions of the first dielectric material over top surfaces of second active areas of the second semiconductor device region and a top surface of the second gate stack.

In some examples, removing the portions of the first dielectric material over the sidewalls of the second gate stack includes: forming a mask layer over the first semiconductor device region; and removing the portions of the first dielectric material over the sidewalls of the second gate stack.

In some examples, the second deposition operation includes: after removing the mask layer, depositing the first dielectric material over the top surfaces of the first active areas and the top surface and sidewalls of the first gate stack and over the top surfaces of the second active areas and the top surface and sidewalls of the second gate stack; and removing portions of the first dielectric material over the top surfaces of the first active areas and the top surface of the first gate stack and portions of the first dielectric material over the top surfaces of the second active areas and the top surface of the second gate stack.

In some examples, before the first deposition operation, the method further includes depositing a second dielectric material different from the first dielectric material over the first semiconductor device region and the second semiconductor device region.

In some examples, the first dielectric material includes silicon nitride and the second dielectric material includes silicon oxide.

In some examples, the first dielectric material deposited during the first deposition operation has a first thickness larger than a second thickness of the first dielectric material deposited during the second deposition operation.

In some examples, when removing the first dielectric material, the second dielectric material is used as an etch stop layer and an etch selection ratio of the first dielectric material to the second dielectric material is at least 10:1.

In another aspect of the present disclosure, a semiconductor apparatus is provided. The semiconductor apparatus includes: a first semiconductor device including a first semiconductor device region of a semiconductor substrate, a first gate stack, and a first gate spacer; and a second semiconductor device including a second semiconductor device region of the semiconductor substrate, a second gate stack, and a second gate spacer, wherein the number of layers of a first dielectric material in the first gate spacer is larger than the number of layers of the first dielectric material in the second gate spacer by one, and a thickness of the first gate spacer is larger than that of the second gate spacer.

In some examples, the first gate spacer includes two dielectric layers formed of the first dielectric material and the second gate spacer includes one dielectric layer formed of the first dielectric material, and the thickness of the first gate spacer is larger than that of the second gate spacer, wherein the two dielectric layers include a first dielectric layer proximate to the first gate stack and a second dielectric layer further away from the first gate stack, and a thickness of the first dielectric layer is larger than that of the second dielectric layer.

In some examples, the first gate spacer includes a second dielectric material, which is different from the first dielectric material and is disposed between the two dielectric layers and the first gate stack, and the second gate spacer includes the second dielectric material disposed between the one dielectric layer and the second gate stack.

In some examples, the first dielectric material includes silicon nitride and the second dielectric material includes silicon oxide.

In some examples, the thickness of the first dielectric layer is in the range of 40-60 nm and the thickness of the second dielectric layer is in the range of 20-35 nm.

In some examples, the second dielectric material has a thickness in the range of 6-15 nm.

In some examples, the semiconductor apparatus further includes an isolating structure between the first semiconductor device region and the second semiconductor device region.

In some examples, the isolating structure includes oxide.

In some examples, the operating voltage of the first semiconductor device is larger than that of the second semiconductor device.

In yet another aspect of the present disclosure, a memory system is provided. The memory system includes: a memory; and a memory controller coupled to the memory and configured to control operations of the memory, wherein at least one of the memory or the memory controller includes the semiconductor apparatus of any one of the examples above.

BRIEF DESCRIPTION OF THE DRAWINGS

To explain the present disclosure more clearly, some examples of the present disclosure will be described below with reference to accompanying drawings. The accompanying drawings to be described hereafter are only accompanying drawings for some examples of the present disclosure, and other drawings can be obtained based on them. In addition, the accompanying drawings to be described hereafter are only schematic figures and are not intended to limit the actual sizes of the products involved in examples of the present disclosure, and the elements in the figures are not necessarily drawn to scale. Throughout the figures, the same reference numerals indicate the same or like components. The above-described and other characteristics, features, advantages and benefits of the present disclosure will become more obvious by means of the following description in connection with the accompanying drawings, wherein.

DETAILED DESCRIPTION

Figure 1:
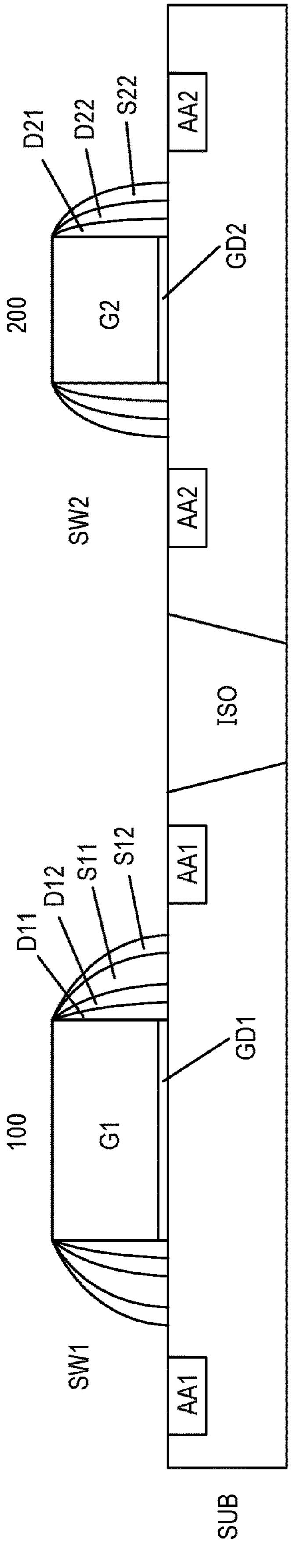
FIG. 1 schematically shows a structure of a semiconductor apparatus in accordance with the present disclosure.

In the present disclosure, different semiconductor devices (e.g., a high-voltage device and a low-voltage device) of the semiconductor apparatus are provided with gate spacers of different thicknesses by two dielectric deposition operations. Due to the use of the two dielectric deposition operations, the present disclosure can both provide the high-voltage device with a gate spacer having a relatively larger thickness and provide the low-voltage device with a gate spacer having a relatively smaller desired thickness, such as a thin gate spacer having a thickness less than 8 nm.

Although specific configurations and arrangements are discussed, this is done for illustrative purposes only. Accordingly, other configurations and arrangements can be used without departing from the spirit and scope of the present disclosure. Further, the present disclosure can also be employed in a variety of other applications. Combination, adjustment and modification may be made to functional and structural features described in the present disclosure in any way other than those shown in the figures, and will still fall within the scope of the present disclosure.

The meaning of "on," "over." and "above" in the present disclosure should be interpreted in the broadest manner such that "on" not only means "directly on" something but also includes the meaning of "on" something with an intermediate feature or a layer therebetween, and that "over" or "above" not only means the meaning of "over" or "above" something but can also include the meaning it is "over" or "above" something with no intermediate feature or layer therebetween (i.e., directly on something).

Further, spatially relative terms, such as "beneath," "below." "lower." "over." "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 180 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc.

Due to the effect of hot carrier injection (HCl), a high-voltage device has a gate spacer having a relatively larger thickness. However, the HCl effect has a relatively smaller influence on a low-voltage device. To increase the degree of integration of semiconductor devices, the thickness of the gate spacer of the low-voltage device may be reduced. In an example according to the present disclosure (referred to as a comparative example hereafter), a gate spacer on sidewalls of a gate stack of a low-voltage device is thinned, so that the low-voltage device is provided with the gate spacer having a relatively smaller thickness. However, the comparative example may face various challenges. For example, it may be challenging for the comparative example to provide the low-voltage device with a gate spacer having a relatively smaller desired thickness. Furthermore, in the comparative example, tops of gate stack and active areas of the low-voltage device may be damaged by subsequent etching processes.

For example, in the comparative example, the following process may be useful to provide a high-voltage device with a gate spacer having a thickness and to provide a low-voltage device with a gate spacer having a different thickness.

A first gate stack of a high-voltage device and a second gate stack of a low-voltage device are formed in a region for a high-voltage device (referred to as a high-voltage device region hereafter) and a region for a low-voltage device (referred to as a low-voltage device region hereafter) of a semiconductor substrate. The first gate stack includes a first gate and a first gate dielectric and the second gate stack includes a second gate and a second gate dielectric. First active areas of the high-voltage device are located in the high-voltage device region of the semiconductor substrate and on opposite sides of the first gate stack. Second active areas of the low-voltage device are located in the low-voltage device region of the semiconductor substrate and on opposite sides of the second gate stack.

A dielectric is formed on top surfaces of the first active areas and the second active areas and on the top surfaces and sidewalls of the first and second gate stacks by a deposition process such as physical vapor deposition (PVD), chemical vapor deposition (CVD), atomic layer deposition (ALD), etc. Subsequently, a mask layer is disposed over the high-voltage device region, leaving the low-voltage device region exposed. A directional etching process (also referred to as an anisotropic etching process) is used to thin the dielectric on the sidewalls of the second gate stack, so that a gate spacer on the sidewalls of the second gate stack has a relatively thinner thickness. Subsequently, the mask layer is removed and portions of the dielectric on the top surfaces of the first active areas and the first gate stack of the high-voltage device and portions of the dielectric on the top surfaces of the second active areas and the second gate stack of the low-voltage device are removed. As a result, a relatively thicker first gate spacer is formed on the sidewalls of the first gate stack of the high-voltage device, and a relatively thinner second gate spacer is formed on the sidewalls of the second gate stack of the low-voltage device.

However, the comparative example above may face various challenges, as described below.

One challenge may be that it may be difficult to obtain the second gate spacer having a relatively smaller desired thickness. In the above-mentioned etching operation used to thin the dielectric on the sidewalls of the second gate stack, no etch stop layer is used to stop the etching process, and therefore, when thinning the dielectric on the sidewalls of the second gate stack, the second gate spacer having the desired thickness is obtained by controlling various parameters such as an etching rate, etching duration and etching temperature with a high precision. However, it may be challenging to realize this technically. For example, the thinner the second gate spacer to be fabricated is, the higher the required control precision is, and correspondingly the more challenging it may be to realize this solution technically. For example, it may be challenging for the above-mentioned comparative example to fabricate a second gate spacer having a thickness less than 8 nm.

Another challenge may be that a top of the second gate stack and tops of the second active areas of the low-voltage device may be damaged by subsequent etching processes. As described above, in the thinning operation, the high-voltage device region is protected by the mask layer and therefore the dielectric on the top surfaces of the first gate stack and the first active areas of the high-voltage device will not be etched. However, even though the directional etching process is used, the dielectric on the top surfaces of the second gate stack and the second active areas may still be removed by the above thinning operation.

For example, in practical processes, when a deposition process is used to form the dielectric on the top surfaces of the first and second active areas and on the top surfaces and sidewalls of the first and second gate stacks, the thickness of the dielectric formed on the top surfaces of the active areas and the top surfaces of the gate stacks is less than the thickness of the dielectric formed on the sidewalls of the gate stacks.

For example, the thickness of the dielectric on the top surfaces of the second active areas and the second gate stack is less than the thickness of the dielectric on the sidewalls of the second gate stack. Accordingly, during the above-mentioned thinning operation, to remove the dielectric of a larger thickness on the sidewalls of the second gate stack, e.g., to obtain a thinner second gate spacer, more dielectric will be removed from the top surface of the second gate stack and the top surfaces of the second active areas by the above-mentioned directional etching process. This may lead to a bigger difference between the thickness of the dielectric on the top surface of the first gate stack and the top surfaces of the first active areas and the thickness of the dielectric on the top surface of the second gate stack and the top surfaces of the second active areas.

After the above-mentioned thinning operation, to expose the tops of the first and second active areas and the tops of the gates in the gate stacks, the dielectric on the top surfaces of the first active areas and the first gate stack of the high-voltage device and the dielectric on the top surfaces of the second active areas and the second gate stack of the low-voltage device need to be removed. Otherwise, source/drain regions cannot be formed in the active areas by ion implantation or epitaxial growth through subsequent operations, and an electrical connection with the gates cannot be achieved through subsequent operations.

However, as noted above, the thickness of the dielectric on the top surfaces of the first active areas and the first gate stack of the high-voltage device is larger than the thickness of the dielectric on the top surfaces of the second active areas and the second gate stack of the low-voltage device. Therefore, after the dielectric on the top surfaces of the second active areas and the second gate stack of the low-voltage device is removed, some dielectric will still remain on the top surfaces of the first active areas and the first gate stack of the high-voltage device.

To remove the remaining dielectric on the top surfaces of the first active areas and the first gate stack of the high-voltage device, a further removing operation needs to be performed after the dielectric on the top surfaces of the second active areas and the second gate stack of the low-voltage device is removed. The further removing operation may damage the tops of the second gate stack and the second active areas of the low-voltage device. For example, the larger the difference in thickness between the dielectric on the top surfaces of the first gate stack and the first active areas and the dielectric on the top surfaces of the second gate stack and the second active areas is, the worse the damage caused to the tops of the second gate stack and the second active areas of the low-voltage device by the further removing operation is.

Examples of the present disclosure will be described in detail with reference to accompanying drawings hereafter. For case of description, the present disclosure will be described hereafter with a planar transistor taken as an example. However, the present disclosure is not only applicable to the planar transistor but also to a non-planar transistor, such as a fin field-effect transistor (FinFET).

FIG. 1 schematically shows a structure of a semiconductor apparatus in accordance with the present disclosure. As shown in FIG. 1, the semiconductor apparatus includes a first semiconductor device 100 and a second semiconductor device 200 that are formed on a semiconductor substrate SUB and separated by an isolating structure ISO including, for example, a shallow trench isolation (STI) structure or a deep trench isolation structure. As shown in FIG. 1, the isolating structure extends through the substrate. However, in some examples, the isolating structure may extend into the substrate for a depth less than a thickness of the substrate.

The first semiconductor device 100 includes a first gate G1, a first gate dielectric GD1, first gate spacer SW1 and first active areas AA1. The second semiconductor device 200 includes a second gate G2, a second gate dielectric GD2, second gate spacer SW2 and second active areas AA2. In the present disclosure, the first gate G1 and the first gate dielectric GD1 are collectively referred to as a first gate stack, and the second gate G2 and the second gate dielectric GD2 are collectively referred to as a second gate stack.

In an example, as shown in FIG. 1, the first gate G1 is located on the semiconductor substrate with the first gate dielectric GD1 disposed therebetween. The second gate G2 is located on the semiconductor substrate with the second gate dielectric GD2 disposed therebetween. A length of the first gate G1 in a horizontal direction (e.g., a gate length) is larger than a length of the second gate G2 in the horizontal direction. The first gate spacers SW1 are located on the sidewalls of the first gate stack, the second gate spacers SW2 are located on the sidewalls of the second gate stack, and a thickness of the first gate spacer SW1 is larger than a thickness of the second gate spacer SW2. The first active areas AA1 are located in the semiconductor substrate and on opposite sides of the first gate stack. The second active areas AA2 are located in the semiconductor substrate and on opposite sides of the second gate stack.

In the present disclosure, a region of the semiconductor substrate in which the first semiconductor device 100 is formed is referred to as a first semiconductor device region, and a region of the semiconductor substrate in which the second semiconductor device 200 is formed is referred to as a second semiconductor device region. In some examples, the first gate G1 and the second gate G2 may include, for example, polysilicon or metal.

As shown in FIG. 1, the first gate spacer SW1 includes dielectric layers S11 and S12 formed of a first dielectric material, and the second gate spacer SW2 includes a dielectric layer S22 formed of the first dielectric material. The first dielectric material may be, for example, silicon nitride. In the present disclosure, the dielectric layers S11 and S12 of the first gate spacer SW1 are formed by a first deposition operation and a successive second deposition operation, and the dielectric layer S22 of the second gate spacer SW2 is formed by the second deposition operation. A thickness of the dielectric layer S11 is larger than a thickness of the dielectric layer S12, and the thickness of the dielectric layer S12 is equal to a thickness of the dielectric layer S22. In some examples, the thickness of the dielectric layer S11 may be in the range of about 40-60 nm, and the thickness of the dielectric layer S12 may be in the range of about 20-35 nm.

In the present disclosure, when thicknesses of different gate spacers of different devices or thicknesses of different dielectric layers are compared, the thicknesses to be compared refer to those of different gate stacks at the same height with respect to the top surface of the substrate or those of different dielectric layers at the same height with respect to the top surface of the substrate.

In some examples, in addition to the two dielectric layers S11 and S12 formed of the first dielectric material, e.g., silicon nitride, the first gate spacer SW1 may include another dielectric layer D12 formed of a second dielectric material different from the first dielectric material, e.g., a silicon oxide layer. Likewise, in addition to the dielectric layer S22 formed of the first dielectric material, e.g., silicon nitride, the second gate spacer SW2 may include another dielectric layer D22 formed of the second dielectric material, e.g., a silicon oxide layer. Furthermore, the first gate spacer SW1 and the second gate spacer SW2 may include additional dielectric layers D11 and D21 formed of the first dielectric material, respectively, e.g., silicon nitride layers.

The above-mentioned dielectric layers D12 and D22 are obtained by forming a dielectric material (e.g., silicon oxide) over the top surfaces and the sidewalls of first and second gate stacks through a blanket deposition process and then performing a directional etching of the dielectric material. The above-mentioned dielectric layers D11 and D21 are obtained by forming a dielectric material (e.g., silicon nitride) on the top surfaces and sidewalls of the first and second gate stacks through a blanket deposition process and then performing a directional etching of the dielectric material.

In some examples, each of the first gate spacer SW1 and the second gate spacer SW2 may further include any additional dielectric layer, for example, a silicon oxide layer disposed between the first gate stack and the silicon nitride layer D11 and/or a silicon oxide disposed between the second gate stack and the silicon nitride layer D21.

As described above, the two dielectric layers S11 and S12 of the first gate spacer SW1 are formed by a first deposition operation and a successive second deposition operation. Between the two deposition operations, the dielectric layer S11 deposited first may be oxidized. For example, when the dielectric layer S11 is a silicon nitride layer, the silicon nitride layer may be oxidized and a silicon oxide layer may be formed on a surface of the silicon nitride layer S11. Thus, the silicon nitride layer S12 deposited later is formed on the silicon oxide layer. Therefore, the first gate spacer SW1 may include a nitride-oxide-nitride (NON) structure, in which the oxide layer is obtained by oxidizing the nitride layer formed first and thus is different from the oxide layer that is obtained by depositing an oxide material over the top surface and sidewalls of the gate stack and then performing a directional etching of the oxide material. For simplicity, the silicon oxide layer between the silicon nitride layers S11 and S12 is not shown in FIG. 1.

In some examples, the silicon oxide layer can be avoided between the silicon nitride layers S11 and S12 by controlling an environment gas, in which the silicon nitride layer S11 is located, to exclude oxygen.

As shown in FIG. 1, the first gate spacer SW1 includes dielectric layers D11, S11 and S12 formed of the first dielectric material, e.g., silicon nitride, and the second gate spacer SW2 includes dielectric layers D21 and S22 formed of the first dielectric material. Thus, the number of the layers of the first dielectric material in the first gate spacer SW1 is larger than the number of the layers of the first dielectric material in the second gate spacer SW2 by one.

Although FIG. 1 shows the dielectric layers D11, D12, S11 and S12 included in the first gate spacer SW1 and the dielectric layers D21, D22 and S22 included in the second dielectric layer SW2, in some examples, the first gate spacer SW1 may include the dielectric layers D12, S11 and S12 and the second gate spacer SW2 may include the dielectric layers D22 and S22. In some examples, the first gate spacer SW1 may only include the dielectric layers S11 and S12 and the second gate spacer SW2 may only include the dielectric layer S22.

In some examples, the first semiconductor device 100 having a relatively thicker first gate spacer SW1 may be a high-voltage device operating with a higher voltage (e.g., in the range of 5-8 volts (V)), and the second semiconductor device 200 having a relatively thinner second gate spacer SW2 may be a low-voltage device operating with a lower voltage (e.g., in the range of 1.1-3.3 V).

Figure 2:
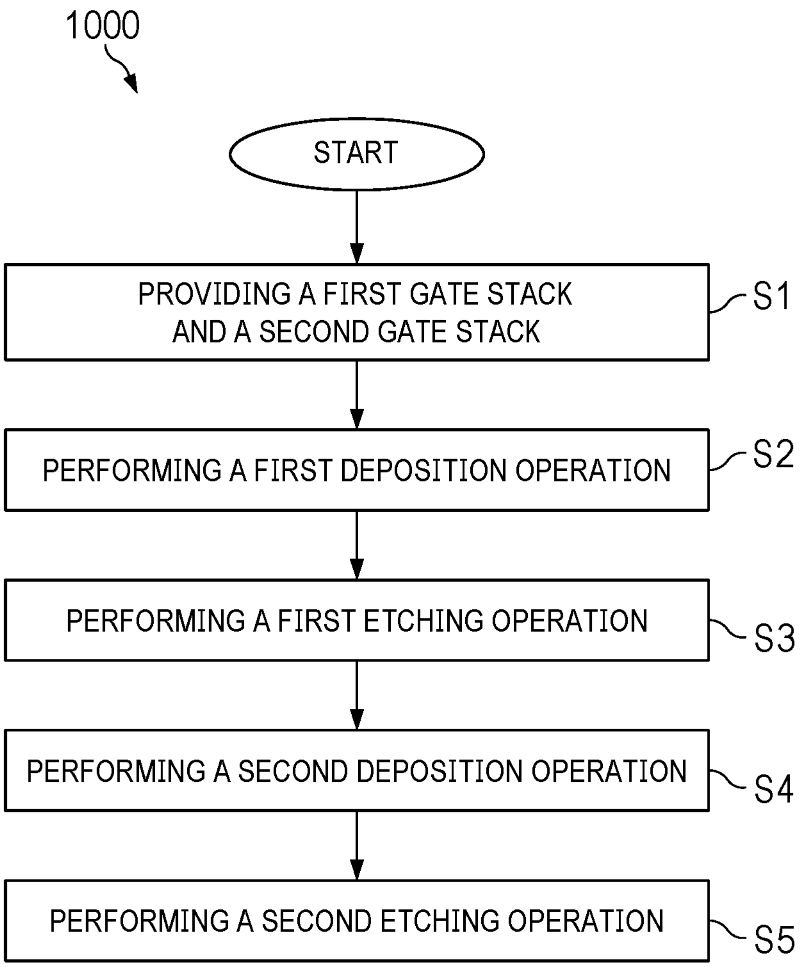
FIG. 2 schematically shows a flowchart of a method of fabricating a semiconductor apparatus in accordance with a first example of the present disclosure.
Figure 5:
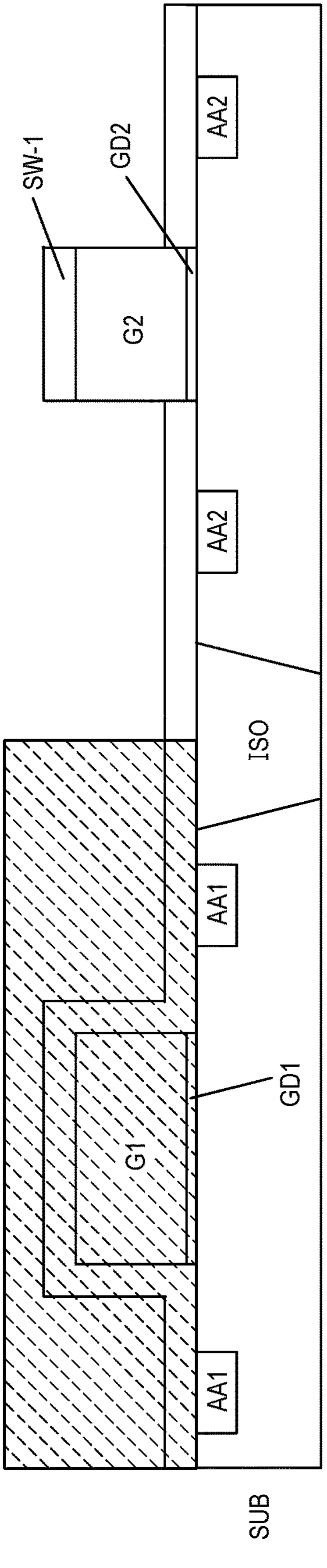
Figure 6:
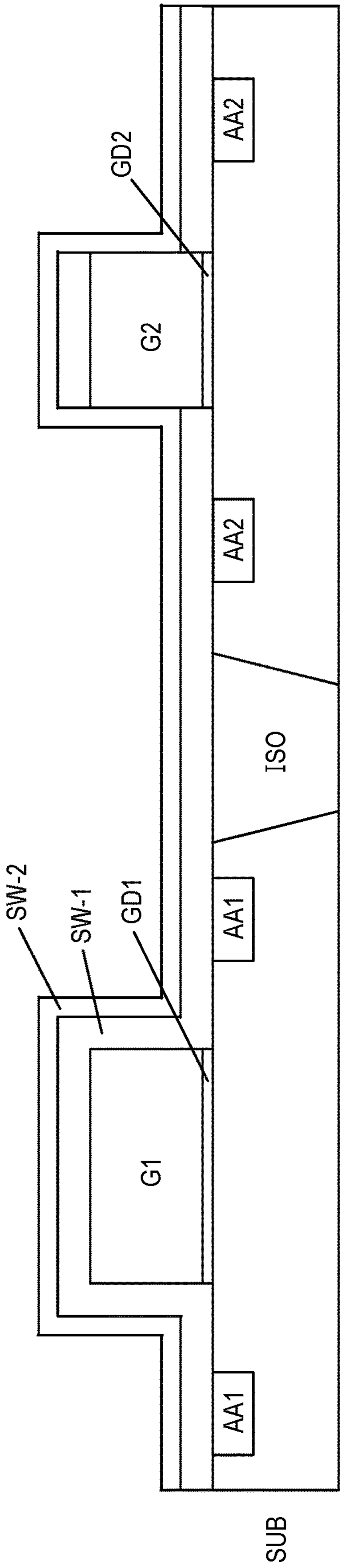
Figure 7:
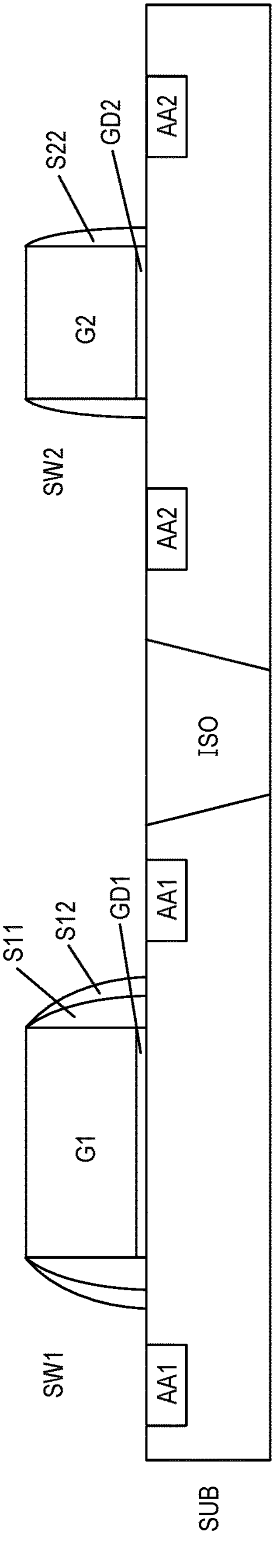

Method 1000 of fabricating a semiconductor apparatus in accordance with a first example of the present disclosure will be described with reference to the flowchart shown in FIG. 2 and in connection with FIGS. 3-7 below, wherein the semiconductor apparatus may include, for example, two semiconductor devices as shown in FIG. 7. These two semiconductor devices are different from the first semiconductor device 100 and the second semiconductor device 200 shown in FIG. 1 in that the dielectric layers D11 and D12 shown in FIG. 1 are not included in the formed first gate spacer, and the dielectric layers D21 and D22 shown in FIG. 1 are not included in the formed second gate spacer. The method 1000 may include operations S1-S5. The operations will be described in detail hereafter.

Figure 3:
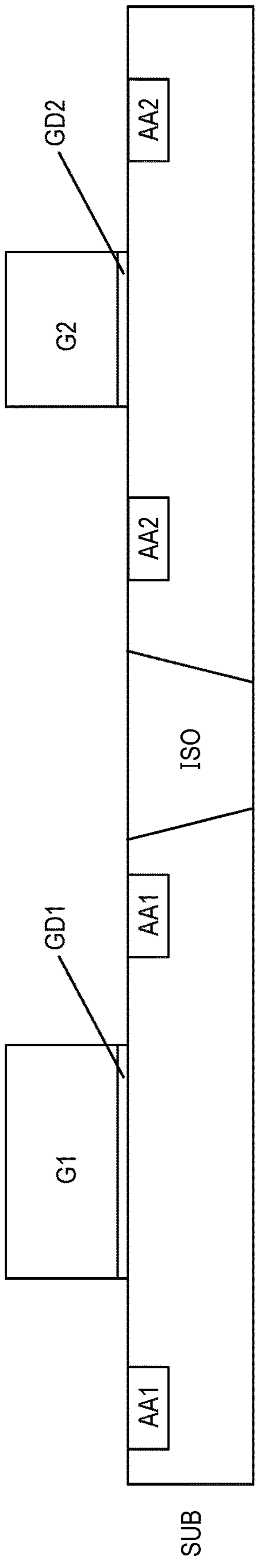
FIGS. 3 to 7 show structural diagrams of a semiconductor apparatus at respective stages when the semiconductor apparatus is fabricated using the method in accordance with the first example of the present disclosure.

Operation S1 includes providing a first gate stack and a second gate stack on a first semiconductor device region and a second semiconductor device region of a semiconductor substrate respectively. As shown in FIG. 3, by depositing a gate dielectric layer and a gate layer and performing etching operations, the first gate stack and the second gate stack are formed respectively on the first semiconductor device region and the second semiconductor device region of the semiconductor substrate SUB that are separated by an isolating structure ISO. The first gate stack includes a first gate G1 and a first gate dielectric GD1. The second gate stack includes a second gate G2 and a second gate dielectric GD2. The first semiconductor device region includes first active areas AA1 on opposite sides of the first gate stack. The second semiconductor device region includes second active areas AA2 on opposite sides of the second gate stack.

Figure 4:
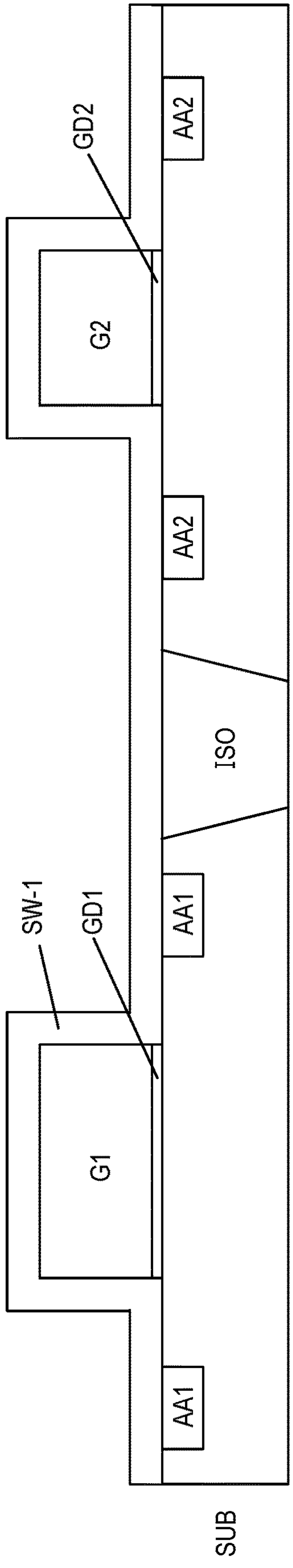

Operation S2 includes performing a first deposition operation of depositing a first dielectric material to form the first dielectric material over top surfaces of the first active areas and sidewalls and top surface of the first gate stack and over top surfaces of the second active areas and sidewalls and top surface of the second gate stack. As shown in FIG. 4, by performing a blanket deposition, a first dielectric material SW-1 of a first thickness is formed over the top surfaces of the first active areas AA1 and the sidewalls and top surface of the first gate stack and over the top surfaces of the second active areas AA2 and the sidewalls and top surface of the second gate stack. For example, the first dielectric material comprises silicon nitride. The first deposition operation may include, but is not limited to, PVD, CVD, ALD, etc. The first thickness is, for example, in the range of 40-60 nm.

In some examples, before the first deposition operation of depositing the first dielectric material, a second dielectric material (e.g., silicon oxide), which may be patterned to form D12 and D22 as shown in FIG. 1 but not shown in FIG. 4 for brevity, different from the first dielectric material may be formed over the top surfaces of the first active areas and the sidewalls and top surface of the first gate stack and over the top surfaces of the second active areas and the sidewalls and top surface of the second gate stack. The thickness of the second dielectric material is, for example, in the range of 6-15 nm. Thus, the first dielectric material SW-1 deposited during the operation S2 may be formed over the previously formed silicon oxide.

In some examples, before formation of the second dielectric material (e.g., silicon oxide), the first dielectric material (e.g., silicon nitride), which may be pattered to form D11 and D21 as shown in FIG. 1 but not shown in FIG. 4 for brevity, may also be formed over the top surfaces of the first active areas and the sidewalls and top surface of the first gate stack and over the top surfaces of the second active areas and the sidewalls and top surface of the second gate stack, so that the first dielectric material SW-1 deposited during the operation S2 may be formed over both of the previously formed silicon nitride and silicon oxide.

Operation S3 includes performing a first etching operation to remove portions of the first dielectric material over the sidewalls of the second gate stack. As shown in FIG. 5, the first etching operation includes: covering the first semiconductor device region and the first gate stack and the first dielectric material SW-1 thereon with a mask layer (indicated by a hatch region in FIG. 5) and exposing the second semiconductor device region and the second gate stack and the first dielectric material SW-1 thereon. The first etching operation also includes performing a directional etching operation to remove the portions of the first dielectric material SW-1 over the sidewalls of the second gate stack, leaving portions of the first dielectric material SW-1 over the top surfaces of the second active areas AA2 and the second gate stack. Then, the mask layer is removed. If the second dielectric material (which may be patterned to form D12 and D22 as shown in FIG. 1 but not shown in FIGS. 3-7) and the first dielectric material SW-1 have been deposited sequentially in the previous operations, then during the first etching operation, the second dielectric material may be used as an etch stop layer.

Operation S4 includes performing a second deposition operation of depositing the first dielectric material to form the first dielectric material over the top surfaces of the first active areas and the sidewalls and top surface of the first gate stack and over the top surfaces of the second active areas and the sidewalls and top surface of the second gate stack. As shown in FIG. 6, by performing a blanket deposition, the first dielectric material SW-2 is formed over the top surfaces of the first active areas AA1 and the sidewalls and top surface of the first gate stack and over the top surfaces of the second active areas AA2 and the sidewalls and top surface of the second gate stack. The second deposition operation may include, but not limited to, PVD, CVD, ALD, etc.

Operation S5 includes performing a second etching operation to remove portions of the first dielectric material over the top surfaces of the first active areas and the top surface of the first gate stack and portions of the first dielectric material over the top surfaces of the second active areas and the top surface of the second gate stack. In an example, the second etching operation is a directional etching operation and includes removing portions of the first dielectric material SW-1 and the first dielectric material SW-2 over the top surfaces of the first active areas AA1 and the top surface of the first gate stack and portions of the first dielectric material SW-1 and the first dielectric material SW-2 over the top surfaces of the second active areas AA2 and the top surface of the second gate stack, so that a first gate spacer SW1 for the first semiconductor device and a second gate spacer SW2 for the second semiconductor device are obtained as shown in FIG. 7. The first gate spacer SW1 may include two dielectric layers S11 and S12 formed by the above-mentioned first deposition operation and the successive second deposition operation. The second gate spacer SW2 may include one dielectric layer S22 formed by the second deposition operation.

If the first dielectric material (which may be patterned to form D11 and D21 as shown in FIG. 1 but not shown in FIGS. 3-7), the second dielectric material (which may be patterned to form D12 and D22 as shown in FIG. 1 but not shown in FIGS. 3-7), the first dielectric material SW-1, and the first dielectric material SW-2 have been deposited sequentially in the previous operations, then the first gate spacer SW1 will include two dielectric layers S11 and S12 formed of the first dielectric material, one dielectric layer (e.g., D12 shown in FIG. 1) formed of the second dielectric material, and an additional dielectric layer (e.g., D11 shown in FIG. 1) formed of the first dielectric material. Further, the second gate spacer SW2 will include one dielectric layer S22 formed of the first dielectric material, one dielectric layer (e.g., D22 shown in FIG. 1) formed of the second dielectric material, and an additional dielectric layer (e.g., D21 shown in FIG. 1) formed of the first dielectric material. If the first dielectric material SW-1 and the first dielectric material SW-2 are deposited on the previously sequentially deposited first dielectric material (which may be patterned to form D11 and D21 as shown in FIG. 1 but not shown in FIGS. 3-7) and the second dielectric material (which may be patterned to form D12 and D22 as shown in FIG. 1 but not shown in FIGS. 3-7), then the second etching operation will remove the portions of the first dielectric material SW-2 and the first dielectric material SW-1 and the portions of the previously deposited second dielectric material (which may be patterned to form D12 and D22 as shown in FIG. 1 but not shown in FIGS. 3-7) and first dielectric material (which may be patterned to form D11 and D21 as shown in FIG. 1 but not shown in FIGS. 3-7) over the top surfaces of the first active areas AA1 and the top surface of the first gate stack and over the top surfaces of the second active areas AA2 and the top surface of the second gate stack.

Although a series of operations have been described in connection with the method 1000, additional operations can be performed. In some examples, after the formation of the first gate spacer and the second gate spacer, source/drain regions may also be formed by performing ion implantation or epitaxial growth in the active areas on the opposite sides of the first gate stack and in the active areas on the opposite sides of the second gate stack with the first gate spacer and the second gate spacer used as a mask layer. In some examples, after the formation of the first gate spacer and the second gate spacer, a gate replacement process can also be performed. For example, when the first gate G1 and the second gate G2 each include polysilicon, the gate replacement process can be performed to replace the polysilicon gates with metal gates.

As described above, in the comparative example, after a single deposition operation of depositing the first dielectric material, the mask layer is used to protect the first dielectric material over the sidewalls of the first gate stack of the high-voltage device, and a directional etching process is performed to thin the first dielectric material over the sidewalls of the second gate stack of the low-voltage device. However, no etch stop layer is used to stop the directional etching process, therefore when thinning the first dielectric material over the sidewalls of the second gate stack, the second gate spacer having the desired thickness can only be obtained by controlling various parameters such as the etching rate, etching duration and etching temperature with a high precision. However, it may be challenging to realize this technically. As a result, the comparative example may suffer from an over etching of the first dielectric material over the sidewalls of the second gate stack, and in turn fails to obtain the second gate spacer having a relatively smaller desired thickness.

In contrast, the second gate spacer having a relatively smaller desired thickness can be obtained by two deposition operations performed sequentially in the above-mentioned method 1000.

In an example, as described above, the gate spacer of the second semiconductor device (e.g., a low-voltage device) is formed by performing the directional etching of the first dielectric material which is deposited on the sidewalls and the top surface of the second gate stack in the second deposition operation. For example, the thickness of the second gate spacer of the low-voltage device depends on the thickness of the first dielectric material deposited over the sidewalls of the second gate stack in the second deposition operation. As compared with controlling the thickness of the thinned first dielectric material over the sidewalls of the second gate stack in the comparative example, the thickness of the first dielectric material deposited over the sidewalls of the second gate stack can be controlled more easily. Therefore, the second gate spacer having a relatively smaller desired thickness, e.g., less than 8 nm, can be formed.

Compared with the comparative example, the above-mentioned method 1000 may provide various improvements, as described above. However, the second etching operation in the method 1000 may cause a degree of damage to the top of the second gate stack.

In an example, as shown in FIG. 5, during the first etching operation performed at operation S3, although the directional etching is used to remove the portions of the first dielectric material SW-1 over the sidewalls of the second gate stack, the directional etching operation may still remove some first dielectric material SW-1 over the top surface of the second gate stack and the top surfaces of the second active areas AA2. This causes the thickness of the dielectric over the top surface of the first gate stack and the top surfaces of the first active areas to be larger than the thickness of the dielectric over the top surface of the second gate stack and the top surfaces of the second active areas. For example, in practical processes, as described above, when the deposition process is used to form the dielectric over the top surfaces of the second active areas and over the top surface and sidewalls of the second gate stack, the thickness of the dielectric formed over the top surfaces of the second active areas and the top surface of the second gate stack is less than the thickness of the dielectric formed over the sidewalls of the second gate stack. Accordingly, to remove the dielectric of a larger thickness over the sidewalls of the second gate stack, more dielectric will be removed from the top surface of the second gate stack and the top surfaces of the second active areas by the above-mentioned directional etching process. This leads to a bigger difference between the thickness of the dielectric over the top surface of the first gate stack and the top surfaces of the first active areas and the thickness of the dielectric over the top surface of the second gate stack and the top surfaces of the second active areas.

Due to the bigger difference in thickness, when the second etching operation in operation S5 is performed, time needed to remove the dielectric with a larger thickness on the top surfaces of the first active areas and the top surface of the first gate stack will be longer than time needed to remove the dielectric of a smaller thickness on the top surfaces of the second active areas and the top surface of the second gate stack. Accordingly, the tops of the second active areas and the second gate stack may be etched slightly and thus be damaged.

Nevertheless, in the comparative example, due to over etching of the dielectric material on the sidewalls of the second gate stack, the difference in thickness is even larger than that in the method 1000 according to the present disclosure. Therefore, compared with the comparative example, the method 1000 according to the present disclosure may cause less damage to the tops of the second gate stack and the second active areas.

Figure 8:
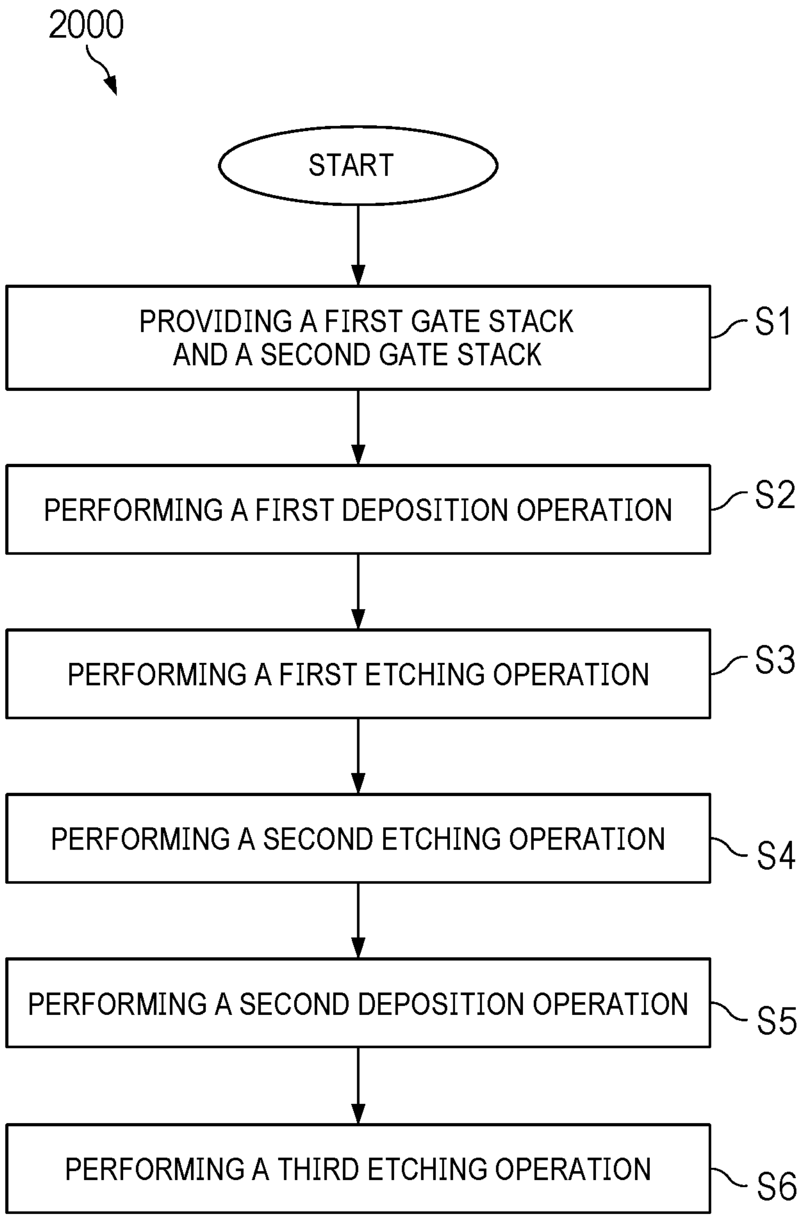
FIG. 8 schematically shows a flowchart of a method of fabricating a semiconductor apparatus in accordance with a second example of the present disclosure.
Figure 12:
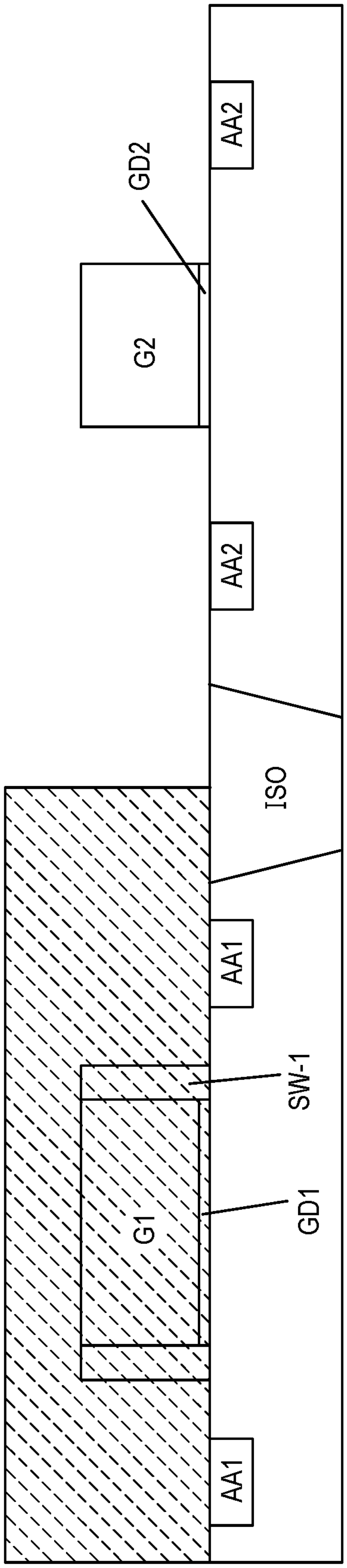
Figure 13:
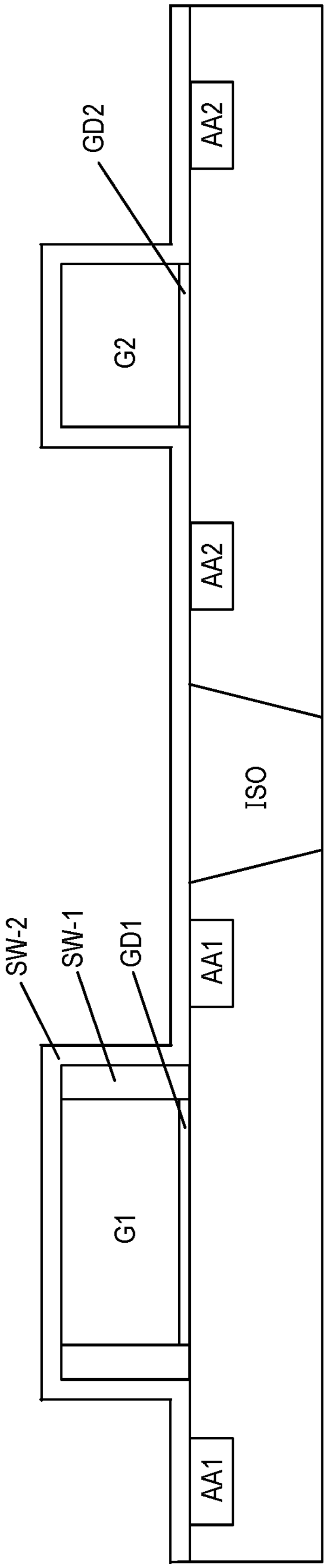
Figure 14:
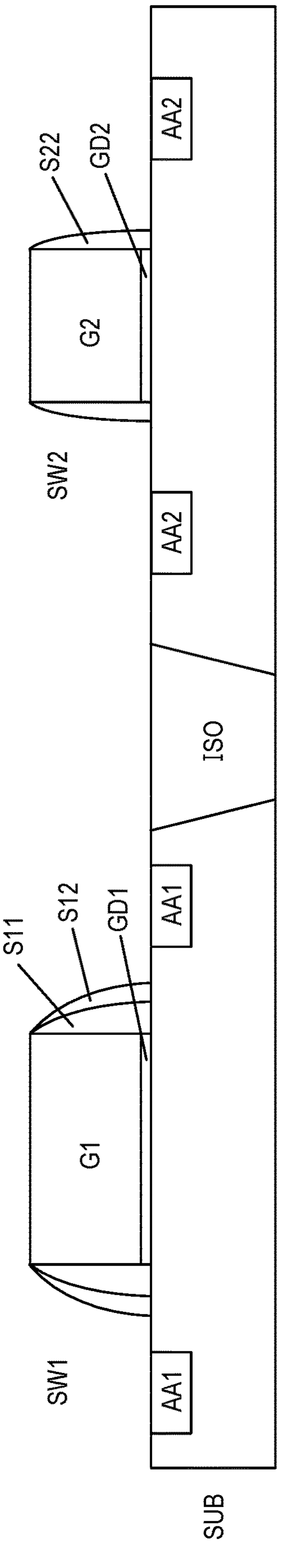

Method 2000 of fabricating a semiconductor apparatus in accordance with a second example of the present disclosure will be described with reference to the flowchart shown in FIG. 8 and in connection with FIGS. 9-14 below, wherein the semiconductor apparatus may include, for example, two semiconductor devices as shown in FIG. 14. These two semiconductor devices are different from the first semiconductor device 100 and the second semiconductor device 200 shown in FIG. 1 in that the dielectric layers D11 and D12 shown in FIG. 1 are not included in the formed first gate spacer, and the dielectric layers D21 and D22 shown in FIG. 1 are not included in the formed second gate spacer. The method 2000 may include operations S1-S6. The operations will be described in detail hereafter.

Figure 9:
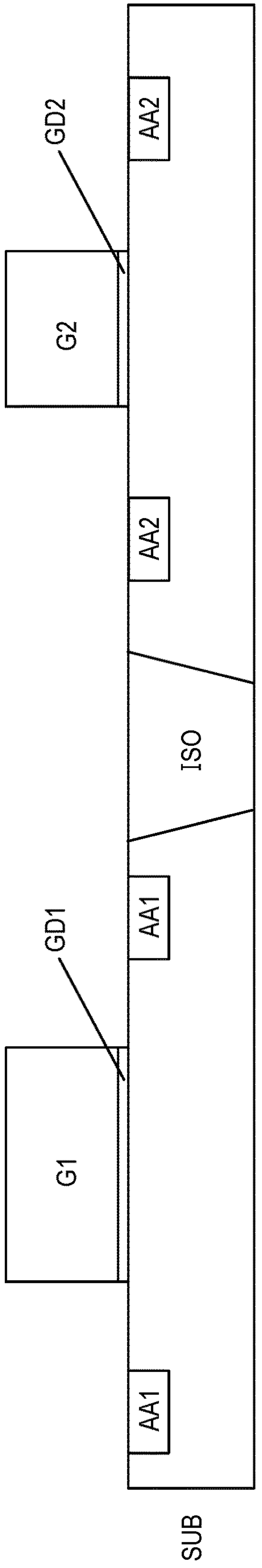
FIGS. 9 to 14 show structural diagrams of a semiconductor apparatus at respective stages when the semiconductor apparatus is fabricated using the method in accordance with the second example of the present disclosure.

Operation S1 includes providing a first gate stack and a second gate stack on a first semiconductor device region and a second semiconductor device region of a semiconductor substrate, respectively. As shown in FIG. 9, by depositing a gate dielectric layer and a gate layer and performing etching operations, the first gate stack and the second gate stack are formed respectively on the first semiconductor device region and the second semiconductor device region of the semiconductor substrate SUB that are separated by an isolating structure ISO. The first gate stack includes a first gate G1 and a first gate dielectric GD1. The second gate stack includes a second gate G2 and a second gate dielectric GD2. The first semiconductor device region includes first active areas AA1 on opposite sides of the first gate stack. The second semiconductor device region includes second active areas AA2 on opposite sides of the second gate stack.

Figure 10:
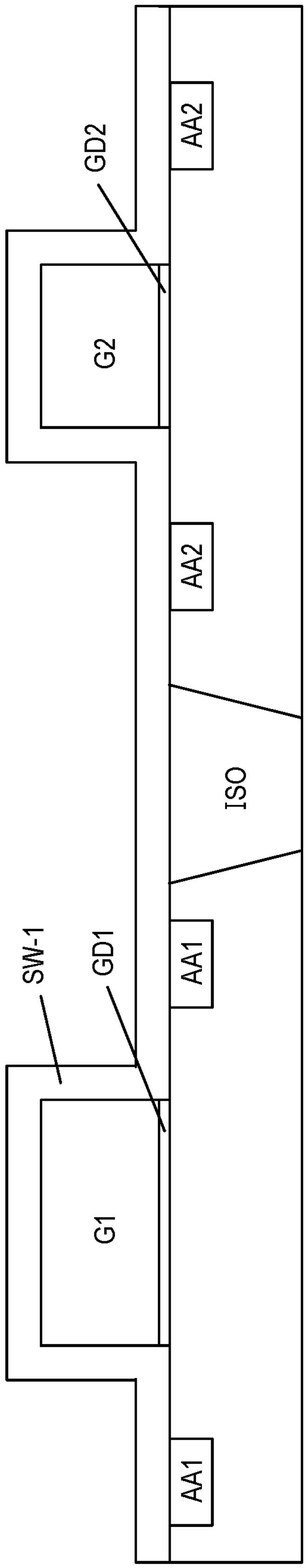

Operation S2 includes performing a first deposition operation of depositing a first dielectric material to form the first dielectric material over top surfaces of the first active areas and sidewalls and top surface of the first gate stack and over top surfaces of the second active areas and sidewalls and top surface of the second gate stack. As shown in FIG. 10, by performing a blanket deposition, a first dielectric material SW-1 of a first thickness is formed over the top surfaces of the first active areas AA1 and the sidewalls and top surface of the first gate stack and over the top surfaces of the second active areas AA2 and the sidewalls and top surface of the second gate stack. For example, the first dielectric material comprises silicon nitride. The first deposition operation may include, but not limited to, PVD, CVD, ALD, etc. The first thickness is for example in the range of 40-60 nm.

In some examples, before the first deposition operation of depositing the first dielectric material, a second dielectric material (e.g., silicon oxide), which may be patterned to form D12 and D22 as shown in FIG. 1 but not shown in FIG. 10 for brevity, different from the first dielectric material is formed over the top surfaces of the first active areas and the sidewalls and top surface of the first gate stack and over the top surfaces of the second active areas and the sidewalls and top surface of the second gate stack. The thickness of the second dielectric material is, for example, in the range of 6-15 nm. For example, the first dielectric material SW-1 deposited during the operation S2 may be formed over the previously formed silicon oxide.

In some examples, before the formation of the second dielectric material (e.g., silicon oxide), the first dielectric material (e.g., silicon nitride), which may be patterned to form D11 and D21 as shown in FIG. 1 but not shown in FIG. 10 for brevity, may also be formed over the top surfaces of the first active areas and the sidewalls and top surface of the first gate stack and over the top surfaces of the second active areas and the sidewalls and top surface of the second gate stack, so that the first dielectric material SW-1 deposited during the operation S2 may be formed over both of the previously formed silicon nitride and silicon oxide.

Figure 11:
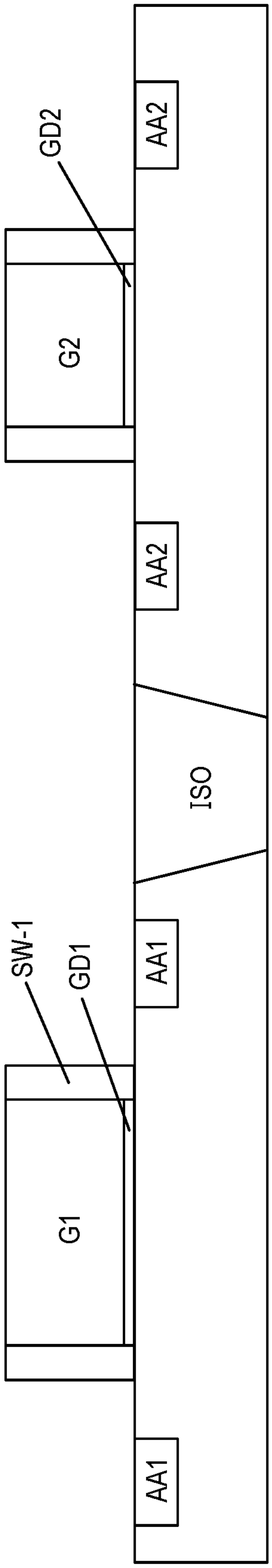

Operation S3 includes performing a first etching operation to remove portions of the first dielectric material over the top surfaces of the first active areas and the top surface of the first gate stack and portions of the first dielectric material over the top surfaces of the second active areas and the top surface of the second gate stack. As shown in FIG. 11, the first etching operation may include: performing a directional etching operation to remove the portions of the first dielectric material SW-1 over the top surfaces of the first active areas AA1 and the top surface of the first gate stack and the portions of the first dielectric material SW-1 over the top surfaces of the second active areas AA2 and the top surface of the second gate stack. If the second dielectric material (which may be patterned to form D12 and D22 as shown in FIG. 1 but not shown in FIGS. 9-14) and the first dielectric material SW-1 have been deposited sequentially in the previous operations, then during the first etching operation, the second dielectric material may be used as an etch stop layer.

Operation S4 includes performing a second etching operation to remove portions of the first dielectric material over the sidewalls of the second gate stack. As shown in FIG. 12, the second etching operation includes: covering the first semiconductor device region and the first gate stack and the first dielectric material SW-1 thereon with a mask layer (indicated by the hatch region in FIG. 12); and performing a directional etching operation to remove the portions of the first dielectric material SW-1 over the sidewalls of the second gate stack. Then, the mask layer is removed. If the second dielectric material (which may be patterned to form D12 and D22 as shown in FIG. 1 but not shown in FIGS. 9-14) and the first dielectric material SW-1 have been deposited sequentially in the previous operations, then during the second etching operation, the second dielectric material may be used as an etch stop layer.

Operation S5 includes performing a second deposition operation of depositing the first dielectric material to form the first dielectric material over the top surfaces of the first active areas and the sidewalls and top surface of the first gate stack and over the top surfaces of the second active areas and the sidewalls and top surface of the second gate stack. As shown in FIG. 13, by performing a blanket deposition, a first dielectric material SW-2 is formed over the top surfaces of the first active areas AA1 and the sidewalls and top surface of the first gate stack and over the top surfaces of the second active areas AA2 and the sidewalls and top surface of the second gate stack. The second deposition operation may include, but not limited to, PVD, CVD, ALD, etc.

Operation S6 includes performing a third etching operation to remove portions of the first dielectric material over the top surfaces of the first active areas and the top surface of the first gate stack and portions of the first dielectric material over the top surfaces of the second active areas and the top surface of the second gate stack. In an example, the third etching operation is a directional etching operation and includes removing the portions of the first dielectric material over the top surfaces of the first active areas AA1 and the top surface of the first gate stack and the portions of the first dielectric material over the top surfaces of the second active areas AA2 and the top surface of the second gate stack, so that a first gate spacer SW1 for the first semiconductor device and a second gate spacer SW2 for the second semiconductor device are obtained as shown in FIG. 14. The first gate spacer SW1 includes two dielectric layers S11 and S12 formed by the above-mentioned first and second deposition operations, and the second gate spacer SW2 includes one dielectric layer S22 formed by the second deposition operation.

If the first dielectric material (which may be patterned to form D11 and D21 as shown in FIG. 1 but not shown in FIGS. 9-14), the second dielectric material (which may be patterned to form D12 and D22 as shown in FIG. 1 but not shown in FIGS. 9-14), the first dielectric material SW-1, and the first dielectric material SW-2 have been deposited sequentially in the previous operations, the first gate spacer SW1 will include two dielectric layers S11 and S12 formed of the first dielectric material, one dielectric layer (e.g., D12 shown in FIG. 1) formed of the second dielectric material and an additional dielectric layer (e.g., D11 shown in FIG. 1) formed of the first dielectric material. The second gate spacer SW2 will include one dielectric layer S22 formed of the first dielectric material, one dielectric layer formed of the second dielectric material (e.g., D22 shown in FIG. 1) and an additional dielectric layer (e.g., D21 shown in FIG. 1) formed of the first dielectric material. If the first dielectric material SW-1 and the first dielectric material SW-2 are deposited on the previously sequentially deposited first dielectric material (which may be patterned to form D11 and D21 as shown in FIG. 1 but not shown in FIGS. 9-14) and the second dielectric material (which may be patterned to form D12 and D22 as shown in FIG. 1 but not shown in FIGS. 9-14), the third etching operation will remove portions of the first dielectric material SW-2 and the first dielectric material SW-1 and portions of the previously deposited second dielectric material (which may be patterned to form D12 and D22 as shown in FIG. 1 but not shown in FIGS. 9-14) and the first dielectric material (which may be patterned to form D11 and D21 as shown in FIG. 1 but not shown in FIGS. 9-14) over the top surfaces of the first active areas AA1 and the top surface of the first gate stack and over the top surfaces of the second active areas AA2 and the top surface of the second gate stack.

Although a series of operations have been described in connection with the method 2000, additional operations can be performed. In some examples, for example, after the formation of the first gate spacer and the second gate spacer, source/drain regions may also be formed by performing ion implantation or epitaxial growth in the active areas on the opposite sides of the first gate stack and in the active areas on the opposite sides of the second gate stack with the first gate spacer and the second gate spacer used as a mask layer. In some examples, after the formation of the first gate spacer and the second gate spacer, a gate replacement process can also be performed. For example, when the first gate G1 and the second gate G2 each include polysilicon, the gate replacement process can be performed to replace the polysilicon gates with metal gates.

As described above, the second etching operation in the method 1000 according to the present disclosure may cause a degree of damage to the tops of the second active areas and the top of the second gate stack, because the first etching operation in the operation S3 may make the thickness of the dielectric over the top surface of the second gate stack and the top surfaces of the second active areas smaller than the thickness of the dielectric over the top surface of the first gate stack and the top surfaces of the first active areas.

In contrast, in the above-mentioned method 2000 according to the present disclosure, three etching operations are performed and, in some examples, before the first deposition operation of depositing the first dielectric material (e.g., silicon nitride), the second dielectric material (e.g., silicon oxide) different from the first dielectric material may be formed, as an etch stop layer, over the top surfaces of the first active areas and the sidewalls and the top surface of the first gate stack and over the top surfaces of the second active areas and the sidewalls and the top surface of the second gate stack. In an example, an etch selection ratio of the first dielectric material to the second dielectric material is at least 10:1, or is 20:1.

As shown in FIGS. 10 and 11, the first etching operation includes removing the portions of the first dielectric material SW-1 over the top surfaces of the first active areas AA1 and the top surface of the first gate stack and the portions of the first dielectric material SW-1 over the top surfaces of the second active areas AA2 and the top surface of the second gate stack at the same time. Therefore, the first etching operation will not cause a difference in thickness between the dielectric over the top surface of the first gate stack and the top surfaces of the first active areas and the dielectric over the top surface of the second gate stack and the top surfaces of the second active areas. For example, due to the second dielectric material used as the etch stop layer, the first etching operation will not cause any damage to the tops of the first active areas AA1 and the first gate stack and the tops of the second active areas AA2 and the second gate stack.

As shown in FIGS. 11 and 12, the second etching operation may include: covering the first semiconductor device region and the first gate stack and the first dielectric material SW-1 thereon with the mask layer; and performing the directional etching operation to remove the portions of the first dielectric material SW-1 over the sidewalls of the second gate stack. Because the second dielectric material is used as the etch stop layer, the second etching operation will cause no damage to the tops of the second active areas AA2 and the top of the second gate stack, and will also cause substantively no difference in thickness between the dielectric over the top surface of the first gate stack and the top surfaces of the first active areas and the dielectric over the top surface of the second gate stack and the top surfaces of the second active areas.

As shown in FIGS. 12-14, the third etching operation may include removing the portions of the first dielectric material SW-2 and the second dielectric material (which may be patterned to form D12 and D22 as shown in FIG. 1 but not shown in FIGS. 9-14) on the top surfaces of the first active areas AA1 and the top surface of the first gate stack and the portions of the first dielectric material SW-2 and the second dielectric material (which may be patterned to form D12 and D22 as shown in FIG. 1 but not shown in FIGS. 9-14) on the top surfaces of the second active areas AA2 and the top surface of the second gate stack at the same time. Because the thickness of the dielectric on the top surfaces of the first active areas AA1 and the top surface of the first gate stack is substantially the same as the thickness of the dielectric on the top surfaces of the second active areas AA2 and the top surface of the second gate stack, the dielectric on the top surfaces of the first active areas AA1 and the top surface of the first gate stack and the dielectric on the top surfaces of the second active areas AA2 and the top surface of the second gate stack can be removed substantially at the same time. Accordingly, the third etching operation may substantially cause no damage to the tops of the first active areas AA1 and the first gate stack and the tops of the second active areas AA2 and the second gate stack. This can further improve performance of the formed semiconductor devices.

Figure 15:
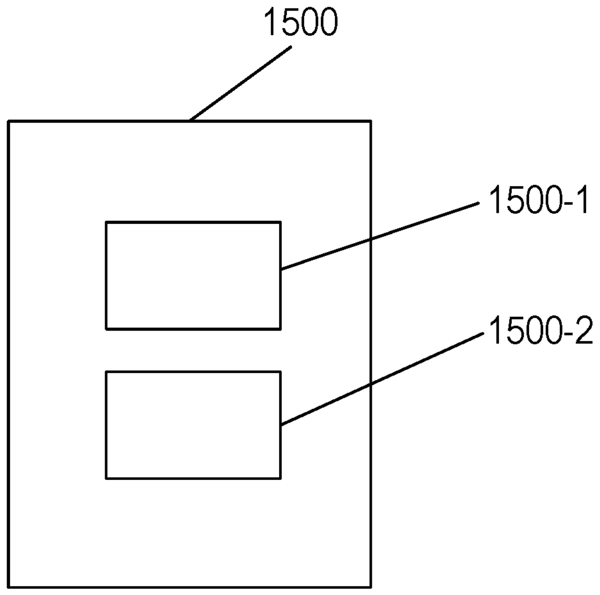
FIG. 15 schematically shows a memory system in accordance with the present disclosure.

FIG. 15 schematically shows a memory system 1500 in accordance with the present disclosure. As shown in FIG. 15, the memory system 1500 may include a memory 1500-1 and a memory controller 1500-2. The memory controller 1500-2 may be coupled with the memory 1500-1 and be configured to control operations of the memory 1500-1. At least one of the memory 1500-1 and the memory controller 1500-2 may include the semiconductor apparatus of any one of the examples above, for example, the semiconductor apparatus as shown in FIG. 1, FIG. 7 or FIG. 14.

The present disclosure is not limited to the examples disclosed above, other aspects that can be derived therefrom by those skilled in the art fall within the scope of the present disclosure. Accordingly, the scope of the present disclosure should be defined by the appended claims.

The term "comprise" or "comprising" does not exclude existence of any other device, layer or operation not listed in the claims or in the specification. The term "one," "a," "an," or "the" preceding the "device," "layer" or "operation" does not exclude existence of multiple such devices, layers or operations.

What is claimed is:

1. A method of fabricating a semiconductor apparatus, comprising:

providing a semiconductor substrate;

forming a first gate stack and a second gate stack on a first semiconductor device region and a second semiconductor device region, respectively, of the semiconductor substrate, the first gate stack comprising a first gate and a first gate dielectric, and the second gate stack comprising a second gate and a second gate dielectric;

performing a first deposition operation of depositing a first dielectric material to form a first dielectric material over a top surface and sidewalls of the first gate stack and over a top surface and sidewalls of the second gate stack;

removing portions of the first dielectric material over the sidewalls of the second gate stack; and performing a second deposition operation of depositing the first dielectric material over the top surface and sidewalls of the first gate stack and over the top surface and sidewalls of the second gate stack to form the first dielectric material over the sidewalls of the first gate stack and the sidewalls of the second gate stack, so that a first gate spacer formed over the sidewalls of the first gate stack has a thickness larger than that of a second gate spacer formed over the sidewalls of the second gate stack, wherein after the second deposition the first dielectric material is in contact with the sidewalls of the first gate stack and the sidewalls of the second gate stack.

2. The method of claim 1, wherein the first semiconductor device region and the second semiconductor device region comprise first active areas and second active areas, respectively, wherein the first active areas are located on opposite sides of the first gate stack, and the second active areas are located on opposite sides of the second gate stack, and wherein the first deposition operation further comprises:

depositing the first dielectric material over top surfaces of the first active areas and over top surfaces of the second active areas.

3. The method of claim 2, wherein removing the portions of the first dielectric material over the sidewalls of the second gate stack comprises:

forming a mask layer over the first semiconductor device region; and removing the portions of the first dielectric material over the sidewalls of the second gate stack.

4. The method of claim 3, wherein the second deposition operation comprises:

after removing the mask layer, depositing the first dielectric material over the top surfaces of the first active areas and the top surface and sidewalls of the first gate stack and over the top surfaces of the second active areas and the top surface and sidewalls of the second gate stack; and removing portions of the first dielectric material over the top surfaces of the first active areas and the top surface of the first gate stack and portions of the first dielectric material over the top surfaces of the second active areas and the top surface of the second gate stack.

5. The method of claim 1, wherein, before removing the portions of the first dielectric material over the sidewalls of the second gate stack, the method further comprises:

removing portions of the first dielectric material over top surfaces of first active areas of the first semiconductor device region and a top surface of the first gate stack and portions of the first dielectric material over top surfaces of second active areas of the second semiconductor device region and a top surface of the second gate stack.

6. The method of claim 5, wherein removing the portions of the first dielectric material over the sidewalls of the second gate stack comprises:

forming a mask layer over the first semiconductor device region; and removing the portions of the first dielectric material over the sidewalls of the second gate stack.

7. The method of claim 6, wherein the second deposition operation comprises:

after removing the mask layer, depositing the first dielectric material over the top surfaces of the first active areas and the top surface and sidewalls of the first gate stack and over the top surfaces of the second active areas and the top surface and sidewalls of the second gate stack; and removing portions of the first dielectric material over the top surfaces of the first active areas and the top surface of the first gate stack and portions of the first dielectric material over the top surfaces of the second active areas and the top surface of the second gate stack.

8. The method of claim 1, wherein, before the first deposition operation, the method further comprises depositing a second dielectric material different from the first dielectric material over the first semiconductor device region and the second semiconductor device region.

9. The method of claim 8, wherein the first dielectric material comprises silicon nitride, and the second dielectric material comprises silicon oxide.

10. The method of claim 9, wherein the first dielectric material deposited during the first deposition operation has a first thickness larger than a second thickness of the first dielectric material deposited during the second deposition operation.

11. A semiconductor apparatus, comprising:

a first semiconductor device, comprising a first semiconductor device region of a semiconductor substrate, a first gate stack, and a first gate spacer; and a second semiconductor device, comprising a second semiconductor device region of the semiconductor substrate, a second gate stack, and a second gate spacer, wherein a number of layers of a first dielectric material in the first gate spacer is larger than a number of layers of the first dielectric material in the second gate spacer by one, wherein the first dielectric material is in contact with the first gate stack and the second gate stack, and a thickness of the first gate spacer is larger than that of the second gate spacer.

12. The semiconductor apparatus of claim 11, wherein the first gate spacer comprises two dielectric layers formed of the first dielectric material and the second gate spacer comprises one dielectric layer formed of the first dielectric material, and the thickness of the first gate spacer larger than that of the second gate spacer, and wherein the two dielectric layers comprise a first dielectric layer proximate to the first gate stack and a second dielectric layer further away from the first gate stack, and a thickness of the first dielectric layer is larger than that of the second dielectric layer.

13. The semiconductor apparatus of claim 12, wherein the first gate spacer comprises a second dielectric material, which is different from the first dielectric material and is disposed between the two dielectric layers and the first gate stack, and the second gate spacer comprises the second dielectric material disposed between the one dielectric layer and the second gate stack.

14. The semiconductor apparatus of claim 13, wherein the first dielectric material comprises silicon nitride, and the second dielectric material comprises silicon oxide.

15. The semiconductor apparatus of claim 14, wherein the thickness of the first dielectric layer is in a range of 40-60 nm, and the thickness of the second dielectric layer is in a range of 20-35 nm.

16. The semiconductor apparatus of claim 15, wherein the second dielectric material has a thickness in a range of 6-15 nm.

17. The semiconductor apparatus of claim 11, further comprising an isolating structure between the first semiconductor device region and the second semiconductor device region.

18. The semiconductor apparatus of claim 17, wherein the isolating structure comprises oxide.

19. The semiconductor apparatus of claim 11, wherein an operating voltage of the first semiconductor device is larger than that of the second semiconductor device.

20. A memory system, comprising:

a memory; and a memory controller coupled to the memory and configured to control operations of the memory, wherein at least one of the memory and the memory controller comprises a semiconductor apparatus, wherein the semiconductor apparatus comprises:

a first semiconductor device, comprising a first semiconductor device region of a semiconductor substrate, a first gate stack, and a first gate spacer; and a second semiconductor device, comprising a second semiconductor device region of the semiconductor substrate, a second gate stack, and a second gate spacer, and wherein a number of layers of a first dielectric material in the first gate spacer is larger than a number of layers of the first dielectric material in the second gate spacer by one, wherein the first dielectric material is in contact with the first gate stack and the second gate stack, and a thickness of the first gate spacer is larger than that of the second gate spacer.

* * * * *